(12) United States Patent
Fan

(10) Patent No.: US 8,552,464 B2
(45) Date of Patent: Oct. 8, 2013

(54) CMOS-COMPATIBLE MOVABLE MICROSTRUCTURE BASED DEVICES

(76) Inventor: Long-Sheng Fan, San Jose, CA (US)

( * ) Notice: Subject to any disclaimer, the term of this patent is extended or adjusted under 35 U.S.C. 154(b) by 507 days.

(21) Appl. No.: 12/422,280

(22) Filed: Apr. 12, 2009

(65) Prior Publication Data

US 2010/0044807 A1 Feb. 25, 2010

Related U.S. Application Data

(60) Provisional application No. 61/044,467, filed on Apr. 12, 2008.

(51) Int. Cl.
*H01L 23/00* (2006.01)

(52) U.S. Cl.
USPC .............................. 257/103; 257/613; 257/615

(58) Field of Classification Search
USPC .......................................... 257/103, 615, 613
See application file for complete search history.

(56) References Cited

U.S. PATENT DOCUMENTS

| 4,740,410 | A | 4/1988 | Muller et al. |
| 5,252,881 | A | 10/1993 | Muller et al. |
| 6,255,671 | B1 * | 7/2001 | Bojarczuk et al. ............. 257/103 |
| 7,075,160 | B2 * | 7/2006 | Partridge et al. .............. 257/414 |
| 7,118,389 | B2 * | 10/2006 | Fork et al. ........................ 439/74 |

OTHER PUBLICATIONS

"Laminated high-aspect-ratio microstructures in a conventional CMOS process", G. Fedder et al., Sensors & Actuators A, v. 57, No. 2, 1996.

* cited by examiner

*Primary Examiner* — Howard Weiss
*Assistant Examiner* — Steven Rao

(57) ABSTRACT

The present invention addresses the aims and issues of making multi layer microstructures including "metal-shell-oxide-core" structures and "oxide-shell-metal-core" structures, and mechanically constrained structures and the constraining structures using CMOS (complimentary metal-oxide-semiconductor transistors) materials and layers processed during the standard CMOS process and later released into constrained and constraining structures by etching away those CMOS materials used as sacrificial materials. The combinations of possible constrained structures and methods of fabrication are described.

13 Claims, 21 Drawing Sheets

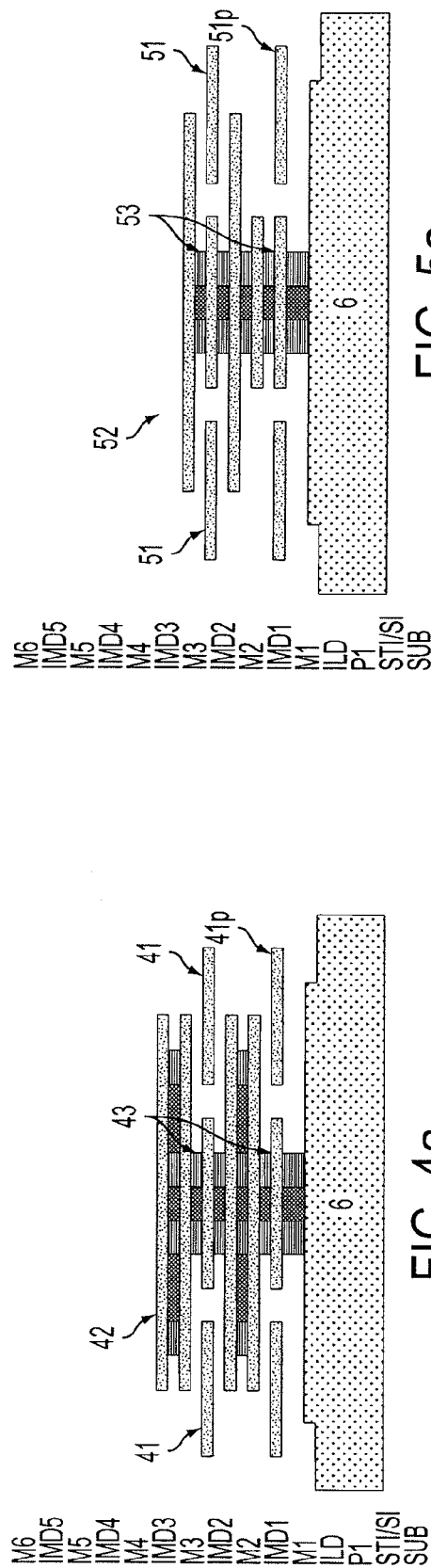

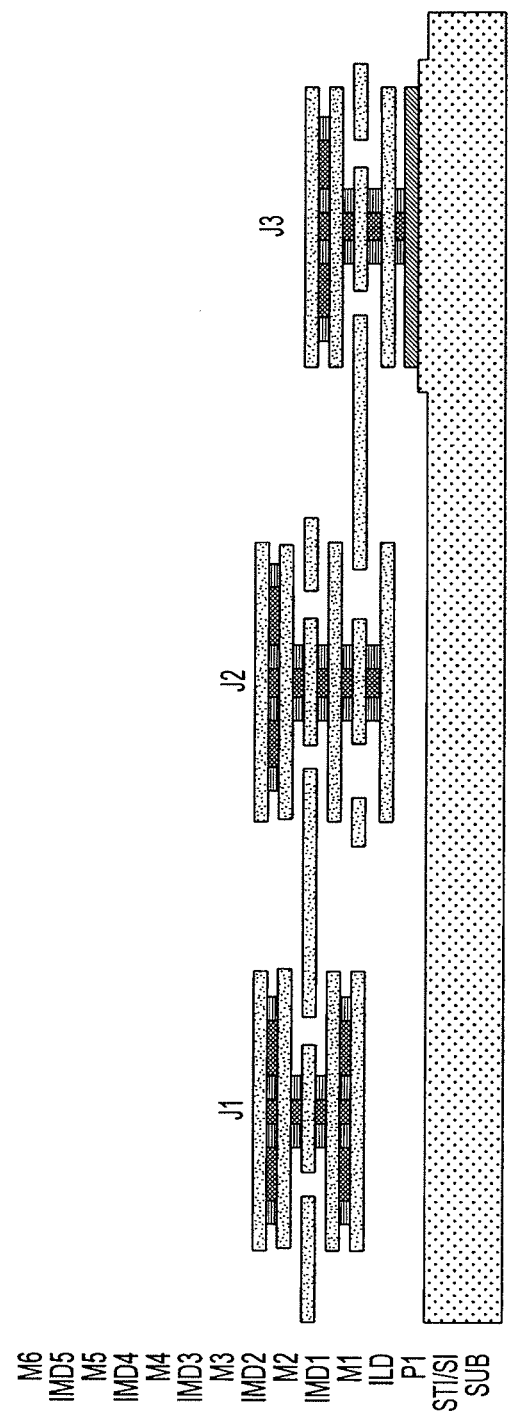

CMOS-COMPATIBLE MOVABLE MICROSTRUCTURE BASED DEVICES

This application is based upon the following filed provisional patent application:
Title: "CMOS-Compatible Constraining Structures and Methods of Fabrication", Application No. 61/044,467, Application Date: Apr. 12, 2008, Inventors: Long-Sheng Fan whose contents are incorporated herein by reference for any and all purposes.

FIELD OF INVENTION

The present invention discloses the methods of making mechanical constraining joint structures using CMOS materials and layers processed during the CMOS process. Such constraining joint structures can be used in micro transducers (sensors and actuators) to achieve certain function, boundary conditions, and constrained movements.

BACKGROUND OF INVENTION

CMOS materials, layers and processes are used to make integrated electronic devices and circuits to perform analog and digital functions. These materials, layers and processes can also be used to fabricate devices to perform sensing and actuation (or transduction) functions at the same time the CMOS circuit is made and later released. Although not necessarily optimized to perform transductions, the advantages of the reduced size, reduced parasitic electrical components and eliminated signal bond pads and their connections (such as wire bonds), IP (intellective property) reuse etc. may make this approach desirable. In the implementation of some transduction functions (motion detection, thermal/chemical etc.), released mechanical components are needed and this release process, consists of dry and/or wet etch process of "sacrificial layers", can be performed after the completion of the CMOS circuitry using a CMOS-compatible post-processing process. Frequently, the released mechanical components are some combination forms of cantilevers, bridges, plates/membranes, posts and anchors with the freedom of bending, torsional rotations, deflections etc. with certain portion of the structures attached directly/indirectly to the substrate. In many situations, higher degrees of freedom such as rigid-body rotations, translations etc. of these components are needed.

SUMMARY OF THE INVENTION

This disclosure describes the method of making the composite microstructures and the constraining joint structures using CMOS materials (such as the multi-layer metal, dielectric interconnect stack) during the CMOS process and later released in a few post processing steps. There are many ways to form CMOS-compatible constraining joints and microstructures as shown in table 1. These microstructures include the "Metal Shell/Oxide Core" (MSOC) composite microstructures and the "Oxide Shell with Metal Core" (OSMC) composite microstructures. The MSOC microstructures are made by forming a full metal enclosure by the interconnect metal (typically aluminum alloys) layers and the via layers, the opening through inter-metal dielectric layers filled with metal (tungsten) to vertically connect different layers of metals, during the CMOS manufacturing process. The surrounding outside sacrificial materials (oxide in this case) of the microstructure is selectively removed in the final release process. The enclosure can have oxide and metals (those used in CMOS process such as aluminum alloys, tungsten) inside. The OSMC microstructures can be made by forming a full oxide enclosure of other CMOS material layers during the CMOS manufacturing process. The surrounding outside sacrificial materials (CMOS metals in this case) of the microstructure is selectively removed in the final release process. The enclosure can have metals (those used in CMOS process such as aluminum alloys, tungsten) and oxides inside.

In the material combination 1, the structure layers can be formed by CMOS metal layers, metal enclosures of oxides and/or CMOS polysilicon layers with various CMOS oxides as the "sacrificial layers", which are used as the spacer layers tentatively during the construction of microstructures, and the material layer is later removed to release the microstructures. Use a mechanical pin join anchored to substrate as an example, the constraining layers are part of the structure layers except the substrate is involved in the anchoring portion. In the material combination 2, the structure layers can be formed by CMOS metal and oxide layers or CMOS oxide layers stack with CMOS metal layers as the sacrificial layers. Use a mechanical pin join anchored to substrate as an example, the constraining layers are part of the structure layers except the substrate is involved in the anchoring portion. These combinations can be used to form various mechanical constraints in a CMOS compatible way as described in details in the following sections.

TABLE 1

CMOS-compatible constraining joints and microstructures:

| | Structure layers | constraint layers | Sacrificial layers |
|---|---|---|---|
| Material Combination 1 | {Metal and/or (metal and via boxes enclosure of oxides) and/or poly} | {Metal and/or (metal and via boxes enclosure of oxides)}&(substrate or poly-oxide-substrate} | Oxides |
| Material Combination 2 | Metal/oxide stack or Oxide/oxide stack | Metal/oxide stack or Oxide/oxide stack | Metal |

BRIEF DESCRIPTION OF THE DRAWINGS

FIG. 4 MSOC for pin structure and multi metal structures: (a) multiple metal structures constrained by flange-pin-flange structure attached to substrate through gate oxide; (b) multiple metal structures constrained by flange-pin-flange structure attached to a polysilicon layer;

FIG. 5 Metal flanges, MSOC pin and multi metal structures: (a) single or multiple metal structures can be constrained by single-layer metal flanges and MSOC pin in the flange-pin-flange structure attached to substrate through gate oxide; (b) single or multiple metal structures can be constrained by single-layer metal flanges and MSOC pin in the flange-pin-flange structure attached to a polysilicon layer;

DETAILED DESCRIPTION OF THE PREFERRED EMBODIMENTS

This disclosure describes the preferred embodiments of the methods of CMOS material combinations to form constraint and the process to make such. The general processes follow the post processing after CMOS passivation. Protective layers such as thick photoresist and/or hard masks or top-layer metal can be used to cover IC and regions/structures need protection. Reactive ion etching (RIE) and vapor-phase HF etch of exposed oxide layers are performed to form multi-layer microstructures out the stack of IC interconnects and followed by optional anisotropic/isotropic silicon etches using high density fluorine plasma (in ICP, ECR or TCP etc.) or $XeF_2$ gas etching. The stack of interconnects are generally metal and dielectric layers, such as the aluminum alloy layers M1, M2, M3, M4, M5, M6, dielectric layers IMD1, IMD2, IMD3, IMD4, IMD5 and via material filling in the openings of each dielectric layers in the case of the "1P-6M" CMOS technology. These stack layers are labeled sequentially to the left of each of the figures.

Figure 1A:
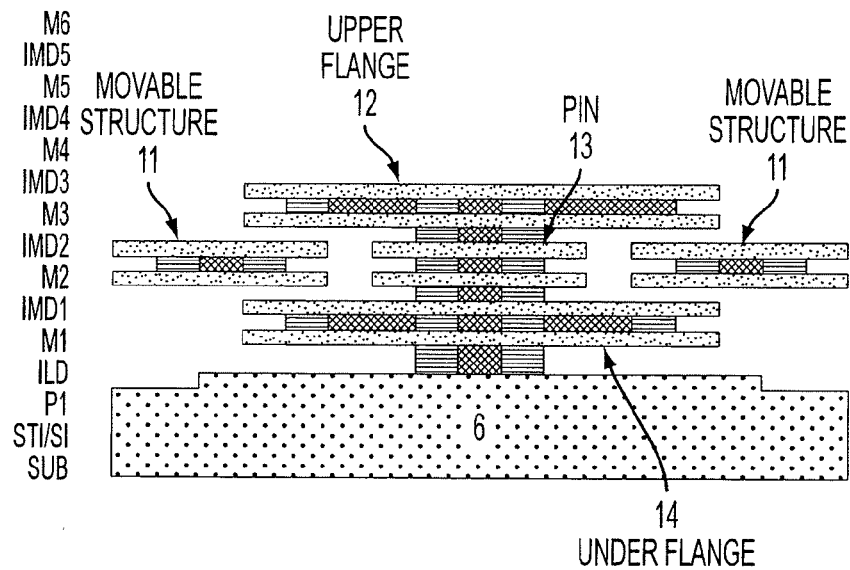
FIG. 1 MSOC (Metal Shell/Oxide Core where the oxide core is completely enclosed by the close surface of the metal shell) for "pin structure" constraining another MSOC structure: (a) MSOC structure constrained by MSOC flange-pin-flange structure attached to substrate; (b) MSOC structure constrained by MSOC flange-pin-flange structure attached to a polysilicon layer; (c) perspective views of constrained structures.
Figure 1B:
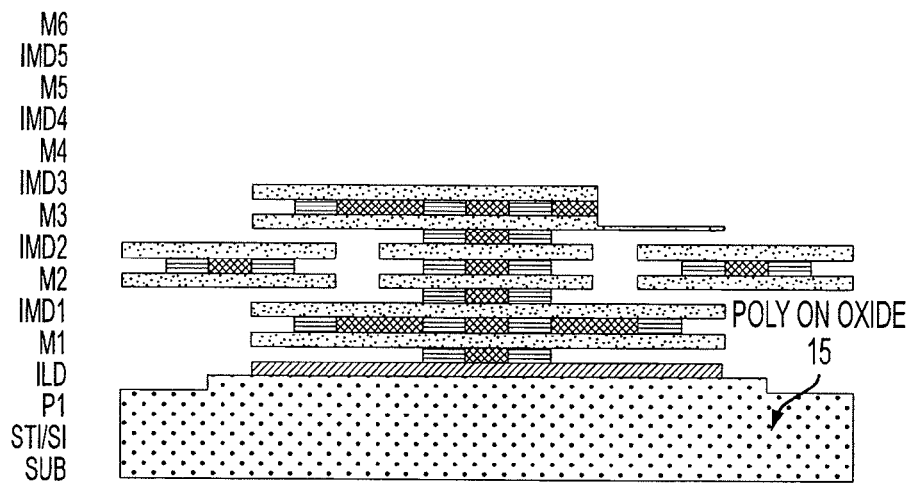
Figure 1C:
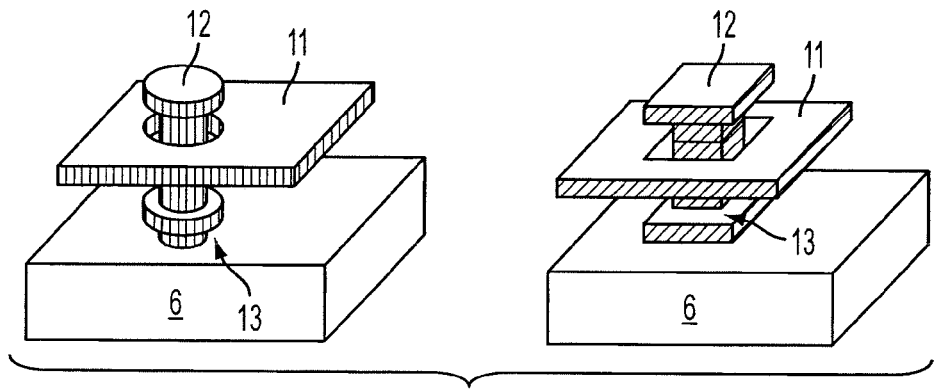

FIG. 1 shows an MSOC (Metal Shell/Oxide Core where the oxide core is completely enclosed by the close surface of the metal shell) for "pin structure" constraining another MSOC structure (the so-called "pin structure" can be rectangle, elliptical or other shapes, but it may give the other constrained structure a rotational degree of freedom if the "pin structure" is cylindrical). As shown in FIG. 1(a), the MSOC structure 11 (typically in Al and Si alloy) is constrained by an MSOC flange-pin-flange structure 12, 13, 14 attached to the substrate 6 through gate oxide opening and electrically contact to the substrate 6. The 11, 12, 14 layers are typically made of a sputter-deposited aluminum and copper, silicon alloy from a fraction of micrometer to a few micrometers thick. The sidewall of the pin layer 13 is typically made of tungsten. There might be some thin inter-layers such as Ti and TiN to increase the layer adhesion and other purposes. FIG. 1(b) shows an MSOC structure 11 is constrained by the MSOC flange-pin-flange 12, 13, 14 structure attached to a polycrystalline silicon (polysilicon, it is typically deposited in a low-pressure chemical vapor deposition process) layer 15 which can be on top of a thin gate oxide for substrate anchoring or on a thicker sacrificial oxide layer later released for multiple links, and the pin joint is electrically isolated from the substrate 6. Notice that the both sides of structure 11 in the cross sectional view are connected as a single piece with an opening to let the pin 13 go through. FIG. 1(c) shows the perspective views of two "pin" constraining structures.

Figure 2A:
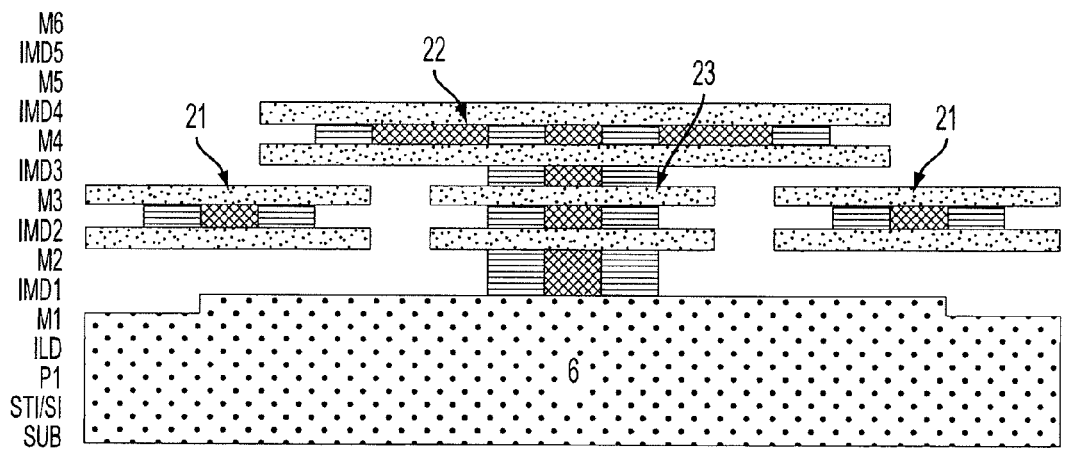
FIG. 2 MSOC pin to substrate structure constraining MSOC structure: (a) MSOC structure constrained by MSOC flange-pin-substrate structure attached to substrate through gate oxide; (b) MSOC structure constrained by MSOC flange-pin-poly structure attached to a polysilicon layer.
Figure 2B:
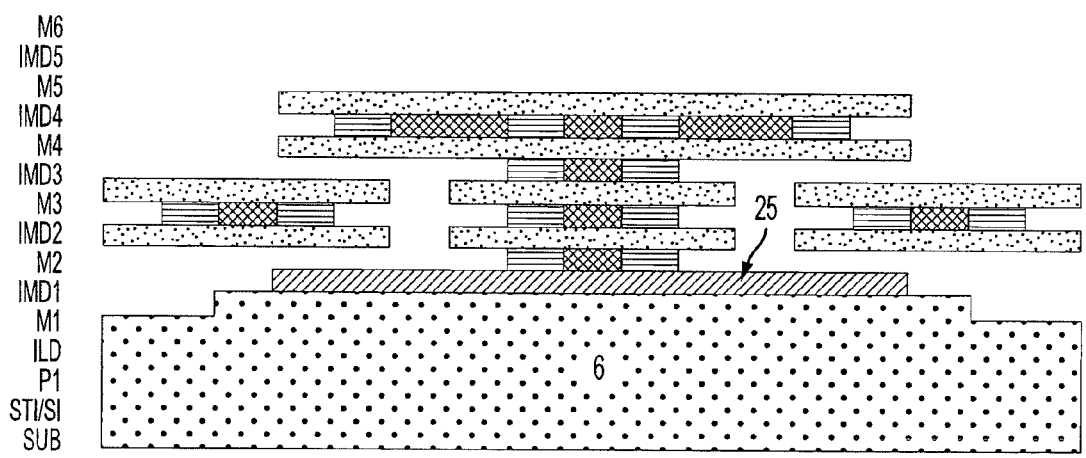

For the constraining purpose, the under flange 14 can be omitted in certain situations as shown in FIG. 2 where the MSOC pin structure anchors the pin 23 directly to the substrate 6 and thus constraining the movement of another MSOC structure 21. The pin joint structure is either electrically connected to substrate or isolated from substrate as shown in FIGS. 2(a) and (b) respectively. The MSOC structure 21 is constrained by the MSOC flange-pin-substrate structure 22, 23, 6 attached to substrate 6 through gate oxide opening as shown in FIG. 2(a) and a MSOC structure is constrained by the MSOC flange-pin-poly structure 22, 23, 25 attached to substrate 6 by a polysilicon layer on oxides 25 as shown in FIG. 2(b).

Figure 3A:
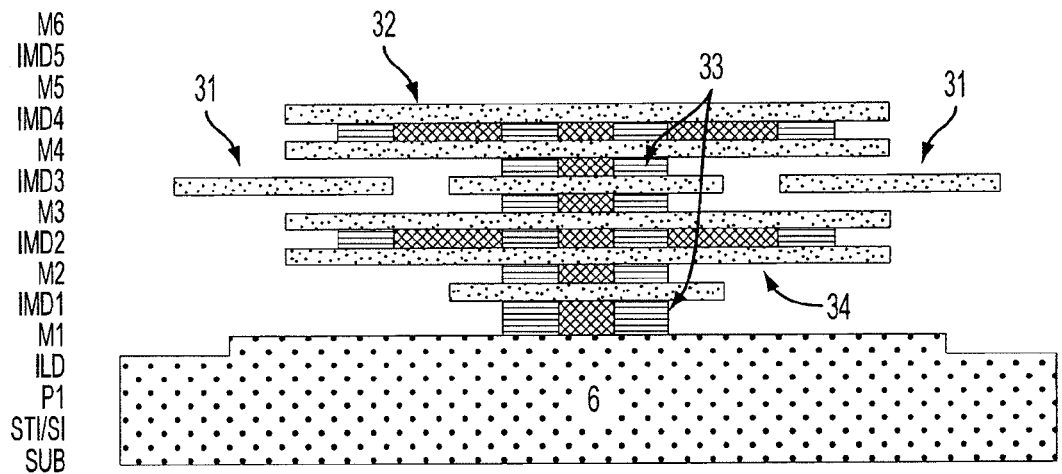
FIG. 3 MSOC pin structure constraining single metal structure: (a) metal structure constrained by flange-pin-flange structure attached to substrate through gate oxide; (b) metal structure constrained by flange-pin-flange structure attached to a polysilicon layer.
Figure 3B:
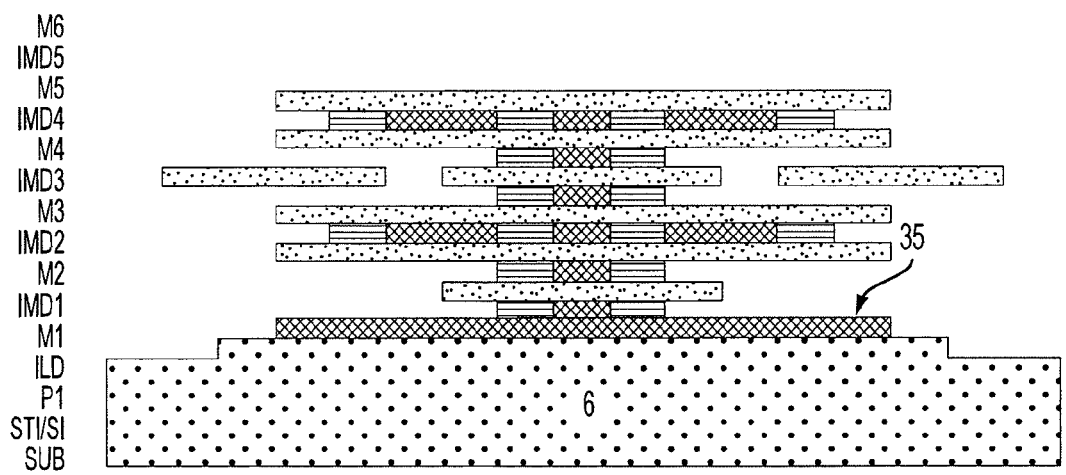

The structure layer can be a single layer as shown in FIG. 3 where the MSOC pin structure is constraining a single-metal-layer structure 31. FIG. 3(a) shows a metal structure 31 constrained by the flange-pin-flange structure 32, 33, 34 attached to substrate 6 through gate oxide opening and FIG. 3(b) shows the metal structure constrained by flange-pin-flange structure 32, 33, 34 attached to substrate by a polysilicon layer and oxide layer 35.

Multiple structures can be constrained in a stack as shown in FIG. 4 where the MSOC is used as flanges 42, 44 and pins 43 for the pin joint structure to constrain multi metal structures 41, 41p and anchors to the substrate 6 either electrically connected to substrate 6 as in FIG. 4(a) or electrically isolated from the substrate 6 by a polysilicon and oxide layers 45 as in FIG. 4(b).

Alternatively, single-layer metal 52, 54 can be used as the flanges in combination with MSOC pins 53 to form pin joint structures as shown in FIG. 5. Anchoring to the substrate can be either electrically connected to substrate 6 as in FIG. 5(a) or electrically isolated from the substrate 6 by a polysilicon and oxide layer 55 as in FIG. 5(b).

The above examples demonstrate the basic idea of using CMOS material layers to form constraining structures and use flanged pin joints as examples. It is obvious to people skilled in the art that the constraining method can be applied not only to round shaped pin joints structures, but also to structures w. opening of any shapes including rectangles, ellipses, slots or traced by any curves.

Figure 6:
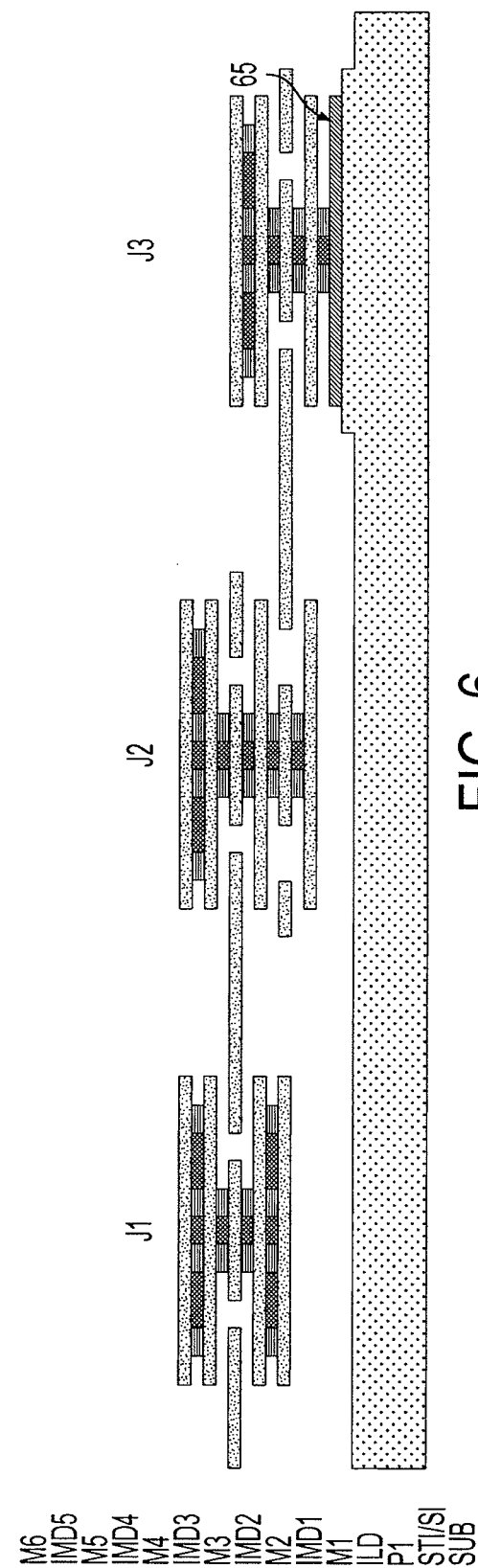
FIG. 6 Multiple links and joints.

The constraining elements and joints can be used in multiple links as shown in FIG. 6. Notice that three pin joints of combinations of MSOC or single metal layers are used to constrain multiple links. The left two joints J1, J2 are not linked to the substrate and the joint J3 on the right hand side is anchored to substrate by polysilicon on oxide layers 65.

An example to fabricate such a structure is depicted in FIG. 17. FIG. 17(a) shows the substrate goes through the conventional CMOS substrate process steps till the gate oxide growth and polysilicon deposition and patterning to form the polysilicon/oxide anchor 17-1. FIG. 17(b) shows the interlayer dielectric (oxides) are deposited, planarized and via opened, W plug formed (tungsten deposition and lapping) followed by Ti, TiN, metal 1 (M1) deposition, patterning. FIG. 17(c) shows the dielectric layers (IMD1) on top of metal 1 (M1) is deposited, planarized followed by via opening, W plug forming, metal deposition, patterning. FIG. 17(d) shows the dielectric layers (IMD2) on top of metal 2 (M2) is deposited, planarized followed by via opening, W plug forming, T, TiN, metal 3 (M3) deposition, patterning. FIG. 17(e) shows the dielectric layers (IMD3) on top of metal 3 (M3) is deposited, planarized followed by via opening, W plug forming, T, TiN, metal 4 (M4) deposition, patterning. FIG. 17(f) shows the dielectric layers (IMD4) on top of metal 4 (M4) is deposited, planarized followed by via opening, W plug forming, T, TiN, metal 5 (M5) deposition, patterning. The FIG. 17(g) shows the dielectric layers (IMD5) on top of metal 5 (M5) is deposited, planarized followed by via opening, W plug forming, T, TiN, metal 6 (M6) deposition, patterning. Metal 1 to M5 are typically a fraction of micrometer in thickness and metal 6 (M6) can be from sub-micrometers to a few micrometers in thickness conventionally used in optional inductors in RF CMOS processes. FIG. 17(h), typical CMOS passivations are conducted and re-opened over the transducers area. A reactive ion etching (RIE) process is conducted to etch the oxide layers using some fluorine ions such as from $CHF_3$ plasma. The mask layers to the CMOS circuit side can be some thick photoresists and the transducers will either utilize the thick metal 6 layer (M6) to protect its underneath structures form RIE knowing that some thickness loss of the metal 6 layer (M6) will happen resulted from the RIE process, or intentionally putting on another layer of hard mask. In FIG. 17(i), the remaining oxide layers are removed either by vapor phase HF etching or by wet HF-based solutions that have high oxide to metals etch selectivity (such as adding glycerol) and with an optional supercritical $CO_2$ release process to control the possible stiction issue of the final released structures. Finally, the fully released multiple links are made in this CMOS compatible process.

Figure 18A:
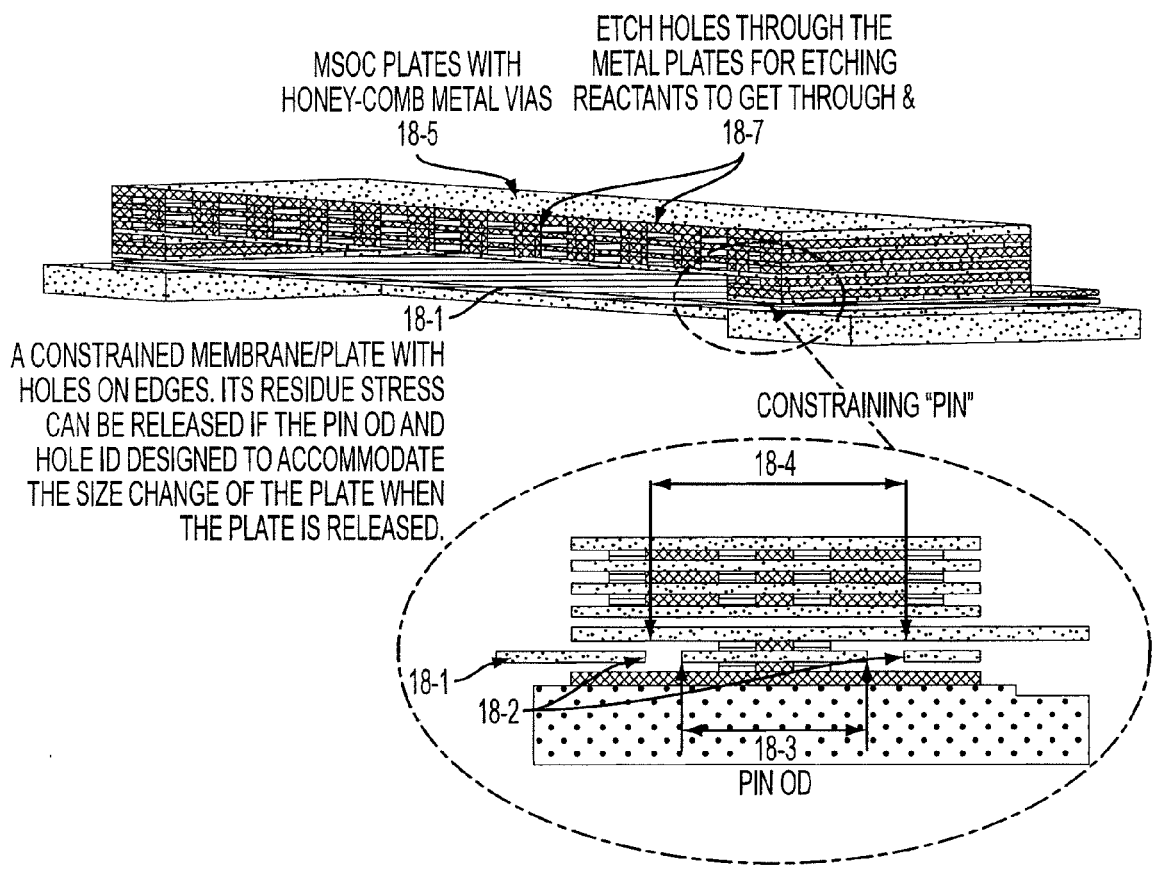
FIG. 18(a). Perspective view of a capacitive pressure sensor structure using the "pin" constrains to release thin film residue stress of the composite layers for making a rigid plate with etch holes; 18(b). Top view of the via layer mask for a composite MSOC plate with etch holes. Portion of the metal via regions forms connected honey-comb" structures and divides the oxide layers into isolated regions between their top & bottom metal plates.
Figure 18B:
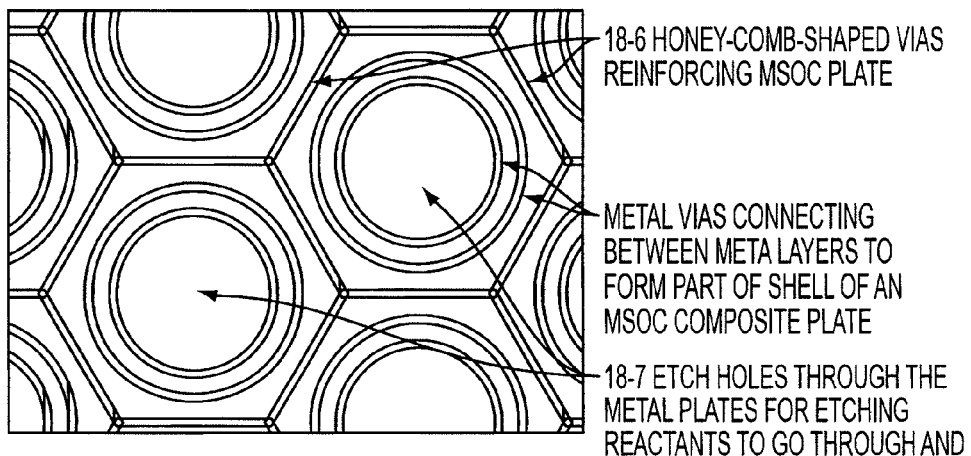

As an example application of the said CMOS-compatible composite structures and constraining structures, FIGS. 18(a) & (b) shows the perspective & top views of a capacitive pressure sensor structure using the "pin" constrains to release the thin film residue stress of the pressure sensing membrane layers 18-1 and a composite plate structure 18-5 for making a rigid plate with etch holes. 18-1 is the constrained membrane/ plate with holes 18-2 on edges. Its residue stress can be released if the pin OD (outer diameter) 18-3 and hole ID (inner diameter) 18-4 designed to accommodate the size change of the plate when the plate is released. The MSOC plates 18-5 with honey-comb metal vias 18-6 & round etch holes 18-7 on the metal plates for etching reactants to get through & to undercut. When the device is released and a voltage difference is applied to the two plates 18-1 & 18-5, the constrained plate will be attracted toward the rigid plate 18-5 and stopped by stopper. When a static or dynamic pressure is applied on the membrane, the membrane movements cause capacitance change between 18-1 & 18-5 and used to convert into electrical signal with a capacitance to voltage conversion circuit. The pressure sensitivity of the membrane depends on the stress of the membrane, and a stress released membrane will greatly increase its pressure sensitivity.

Figure 7A:
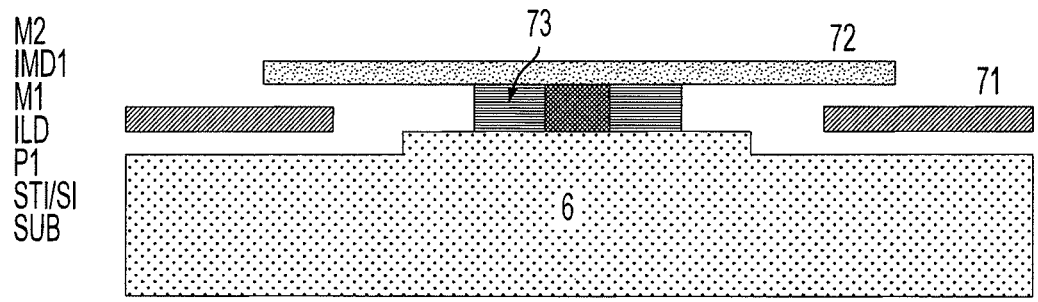
FIG. 7 The polysilicon structure is constrained by metal flange and metal via/oxide box anchored to substrate through gate oxide. Top: single via metal enclosure of oxide, Middle: multiple via enclosure of oxides, Bottom: inner and outer via enclosure of oxides for structures with topological holes.
Figure 7B:
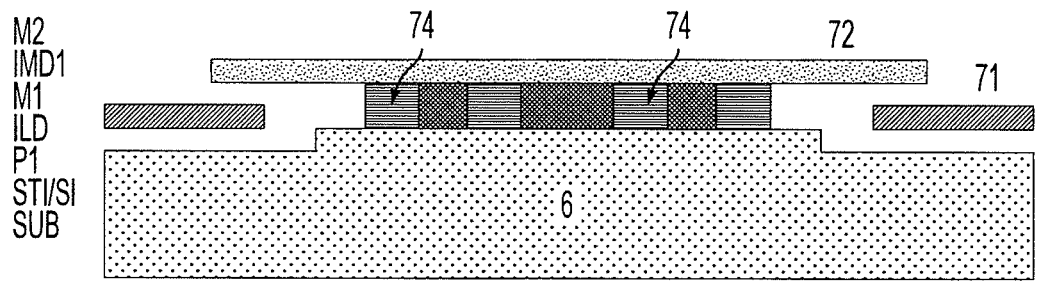
Figure 7C:
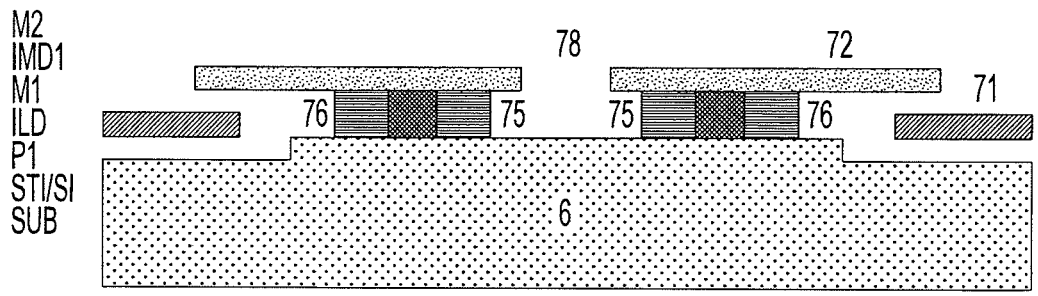

The pin joint structure can be formed by a MSOC composite structure as the pin with a single layer of closed metal side wall formed by the via metal of CMOS or formed by multiple layers of vias. FIG. 7 shows a polysilicon structure 71 is constrained by the metal flange 72 and metal via/oxide box anchored to substrate through gate oxide. FIG. 7(a) shows the single via metal enclosure 73 of oxide MSOC structure, FIG. 7(b) shows the multiple via enclosure 74 of oxides, and FIG. 7(c) shows the inner 75 and outer 76 via enclosure of oxides for structures with topological holes 78. These pin joint structures are electrically connected to the substrate 6.

Figure 8A:
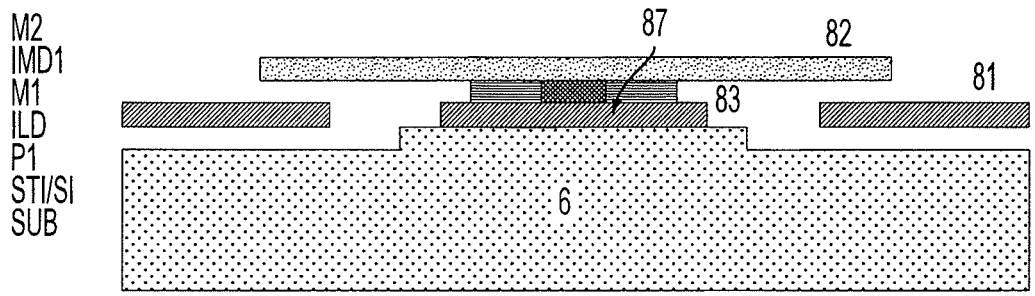
FIG. 8 The polysilicon structure is constrained by metal flange and metal via/oxide box attached to polysilicon over gate oxide and substrate. Top: single via metal enclosure of oxide, Middle: multiple via enclosure of oxides, Bottom: inner and outer via enclosure of oxides for structures with topological holes.
Figure 8B:
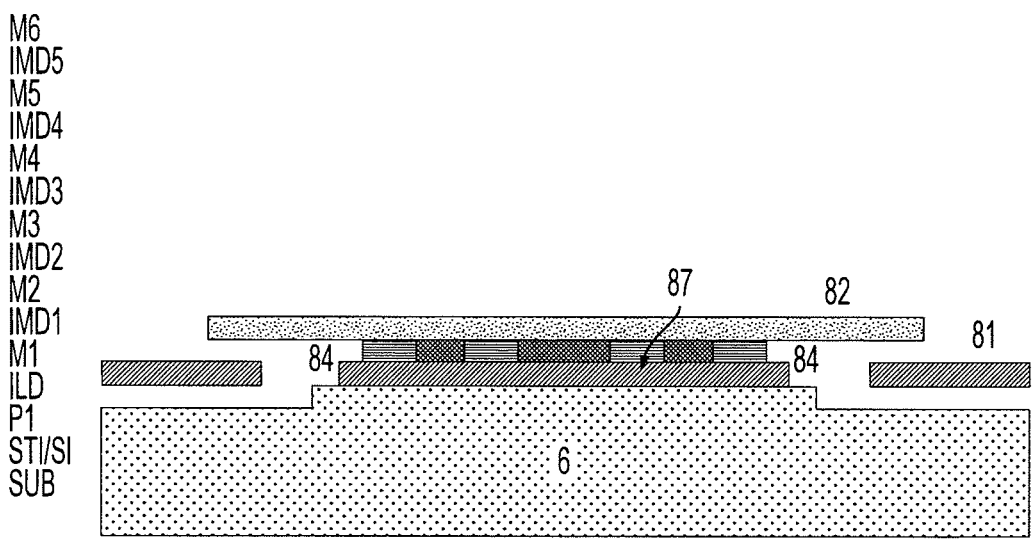
Figure 8C:
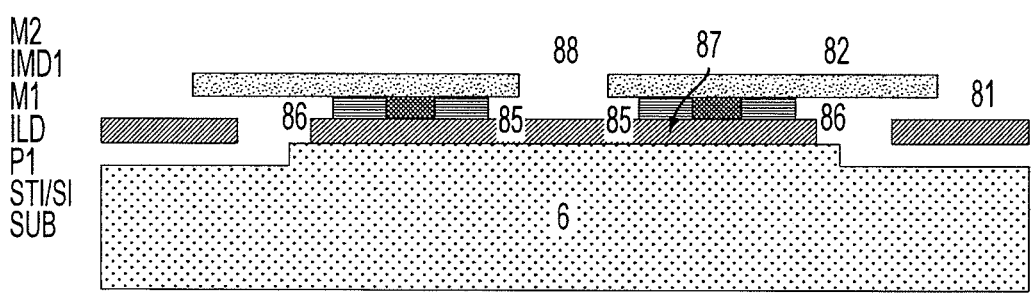

Alternatively, a layer of polysilicon 87 can be used to stop the via opening etch and electrically isolate the pin joint from the substrate 6 with the oxide layers underneath the polysilicon layer as shown in FIG. 8. FIG. 8(a) shows the single via metal enclosure 83 of oxide, FIG. 8(b) shows the multiple via enclosure 84 of oxides, and FIG. 8(c) shows the inner 85 and outer 86 via enclosure of oxides for structures with topological holes 88.

Figure 9:
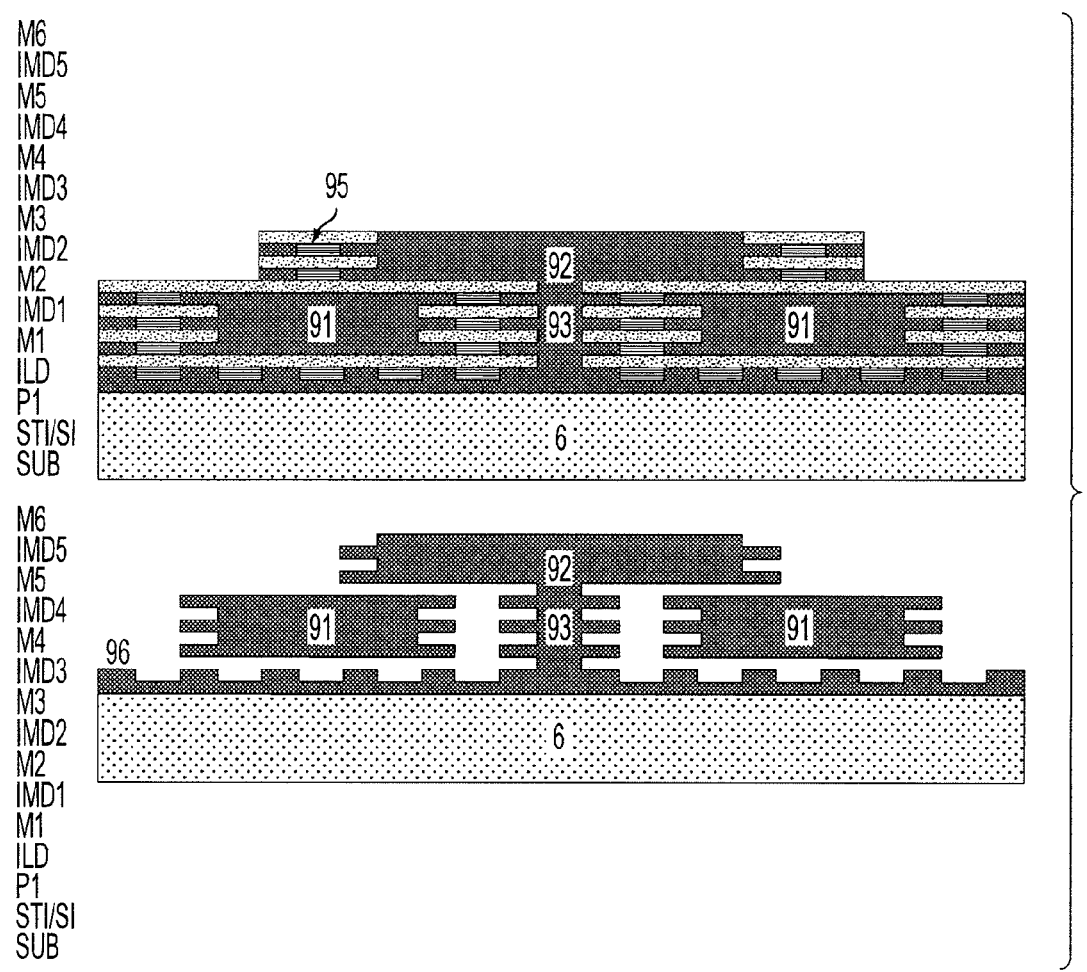
FIG. 9 Oxide structures with oxide constraints anchored to substrate. Top: After oxide RIE and before metal removal, Bottom: After metal removal.

In an alternative material combination, metal layers can be used as sacrificial material and leaving oxide and/or oxide-enclosed metals as the structure components. The post CMOS processing steps for making these are the same as those for CMOS MEMS process except the additional exposed metal etching step using metal etchants. FIG. 9 shows an oxide structure 91 with oxide constraints 92, 93 anchored to substrate 6. Standard CMOS process produces some buried interconnecting metal network 95 as shown in the top figure after oxide RIE and before metal (aluminum alloys) removal using associated etchants in the post processing steps. The bottom figure shows the final oxide structure 91, 92, 93 after metal removal with metal etchants.

Figure 10:
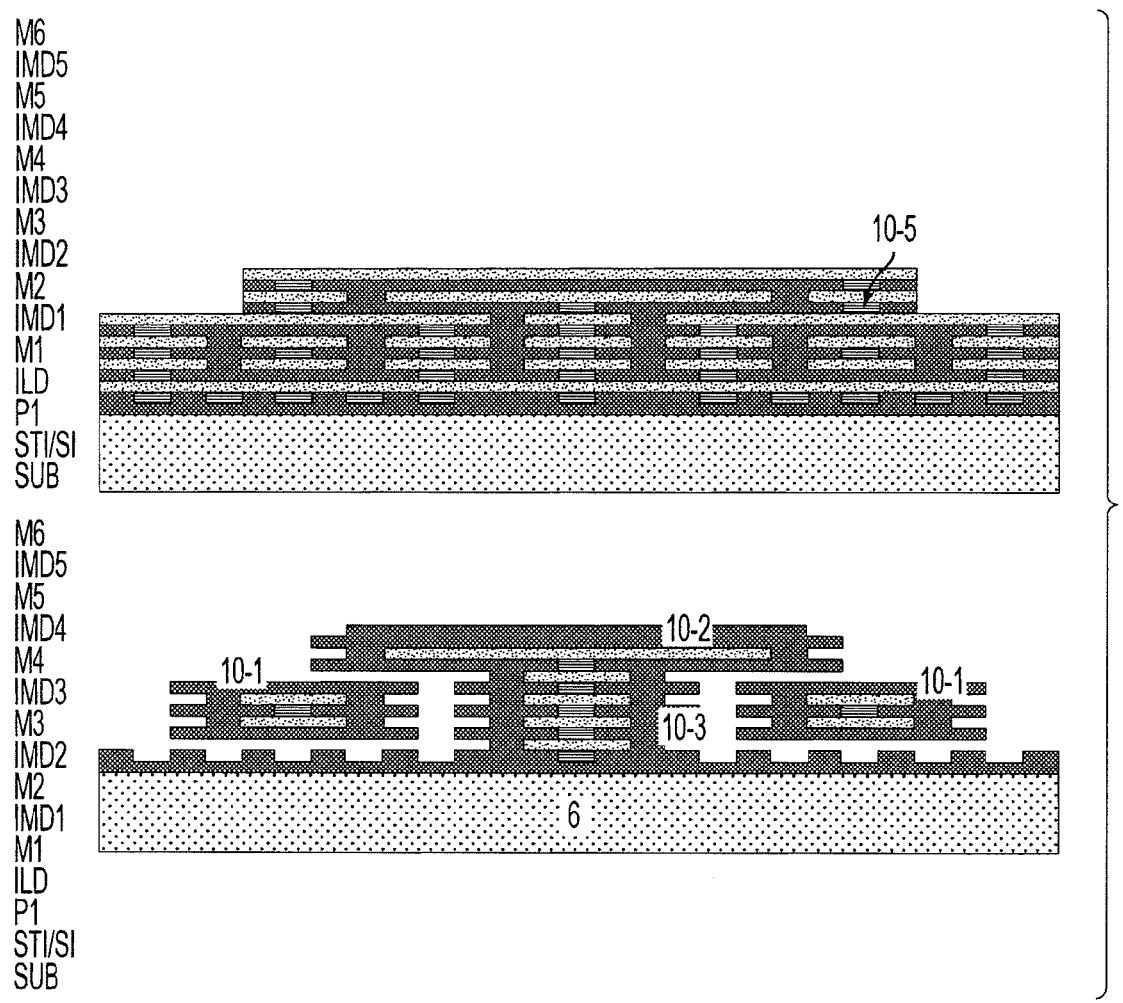
FIG. 10 OSMC (Oxide Shell with Metal Core) structures with OSMC constraints anchored to substrate. Top: After oxide RIE and before metal removal, Bottom: After metal removal.

FIG. 10 shows an alternative OSMC (Oxide Shell with Metal Core) structure 10-1 with OSMC constraints 10-2, 10-3 anchored to substrate. The top figure shows the structure after oxide RIE and before metal removal step in the post processing, and the bottom figure shows the structure after the metal removal by metal etchants. All these structures may need the typical stiction control measures such as dimples 96, 10-6, super critical $CO_2$ release or self-assembled monolayer (SAM) techniques.

Figure 11:
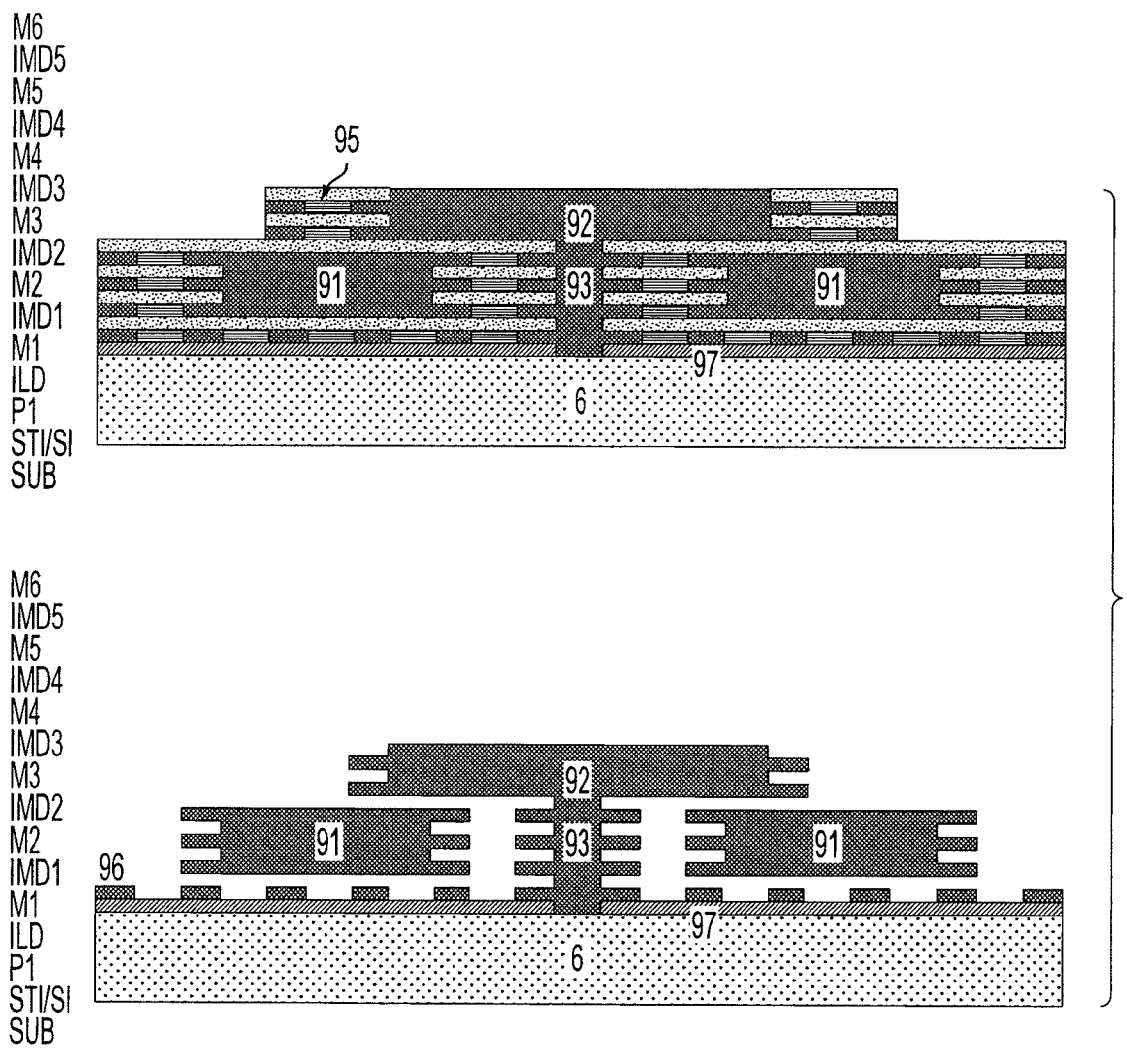
FIG. 11 Oxide structures with oxide constraints anchored to a polysilicon layer. Top: After oxide RIE and before metal removal, Bottom: After metal removal.
Figure 12:
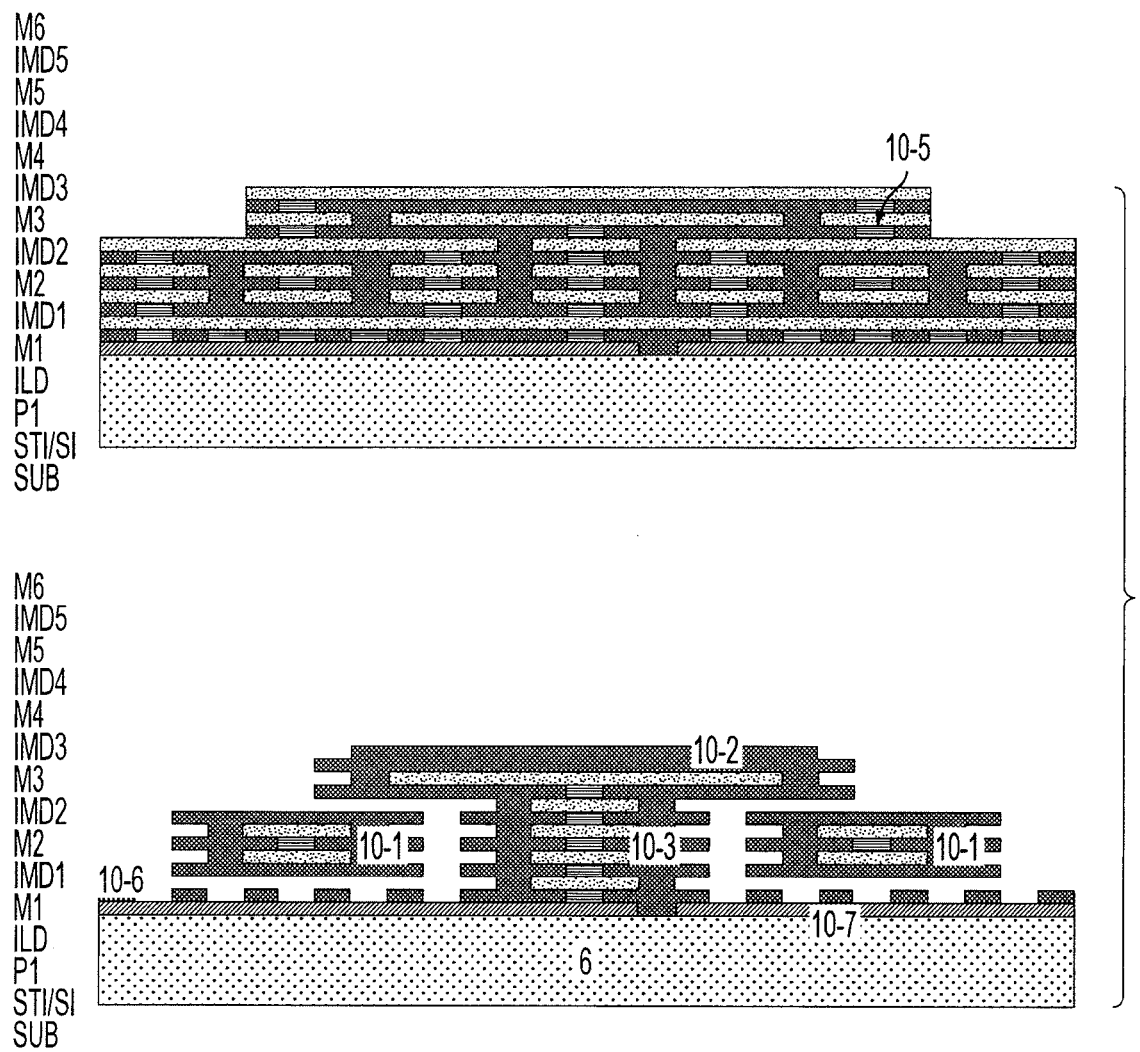
FIG. 12 OSMC structures with OSMC constraints anchored to a polysilicon layer. Top: After oxide RIE and before metal removal, Bottom: After metal removal.

The conducting polysilicon layers 97, 10-7 may be used in combination with these structures (91, 92, 93, 95) and (10-1, 10-2, 10-3) as shown in FIG. 11, 12. FIG. 12 shows an OSMC structure 10-1 with OSMC constraints 10-2, 10-3 anchored to a polysilicon layer 10-7. Structures after the oxide RIE and before metal removal in the post processing is shown on the top figure and after the final metal removal is shown in the bottom figure. This allows the electrical connections to the metal core of the pin joints.

Figure 13:
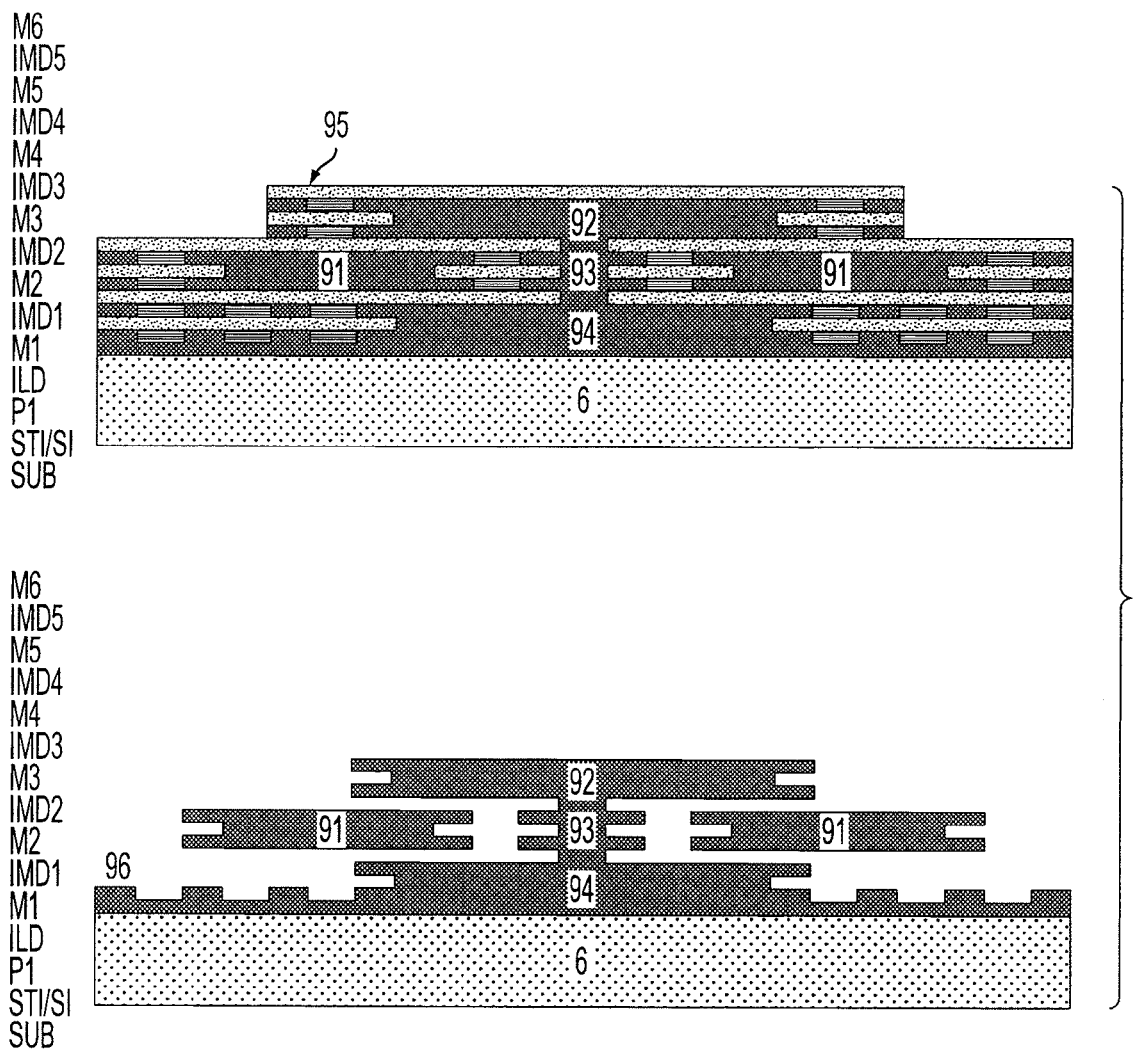
FIG. 13 Oxide structures with oxide flange-pin-flange constraints on substrate. Top: After oxide RIE and before metal removal, Bottom: After metal removal.
Figure 14:
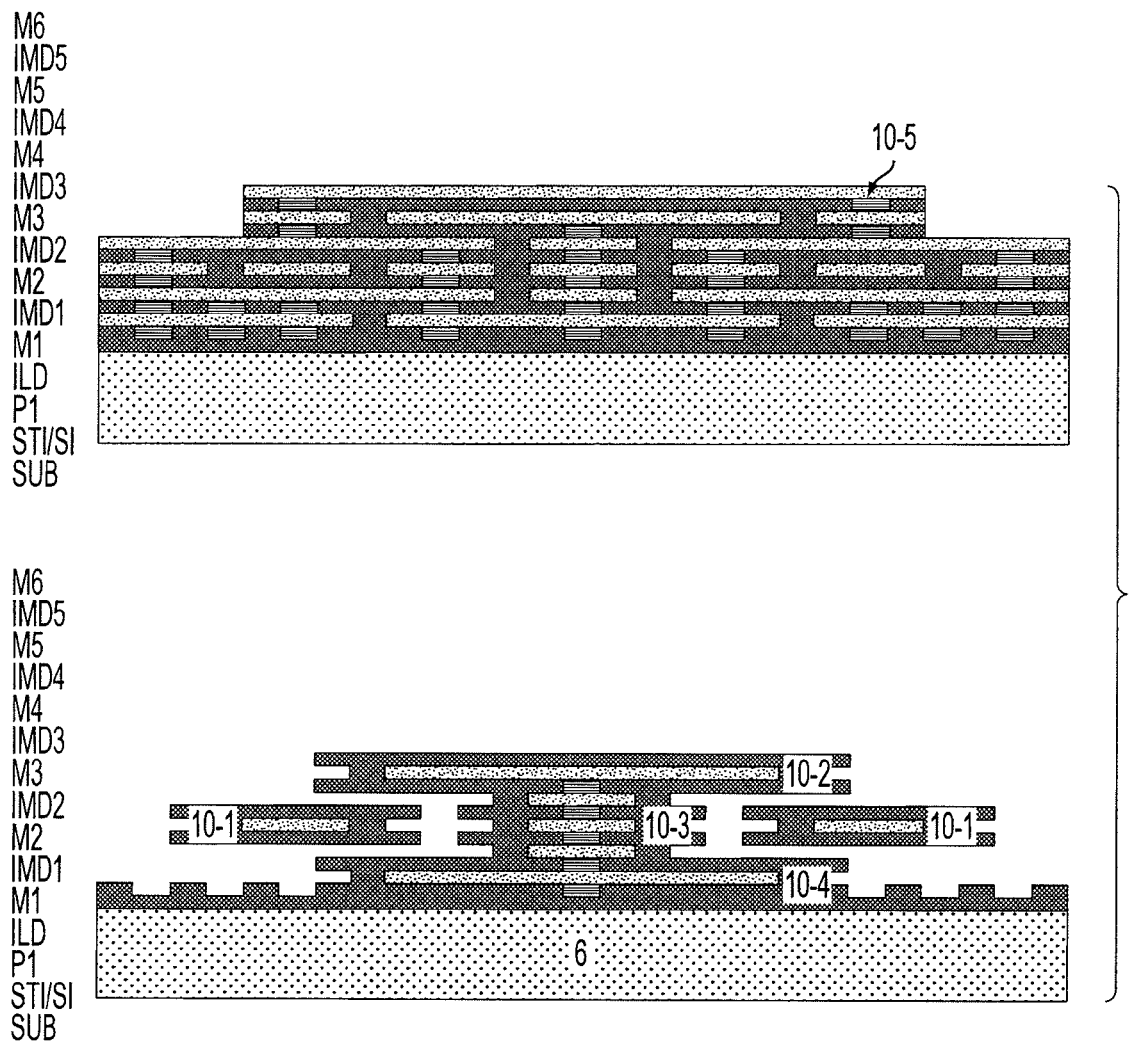
FIG. 14 OSMC structures with OSMC flange-pin-flange constraints. Top: After oxide RIE and before metal removal, Bottom: After removal of exposed metal material.
Figure 15:
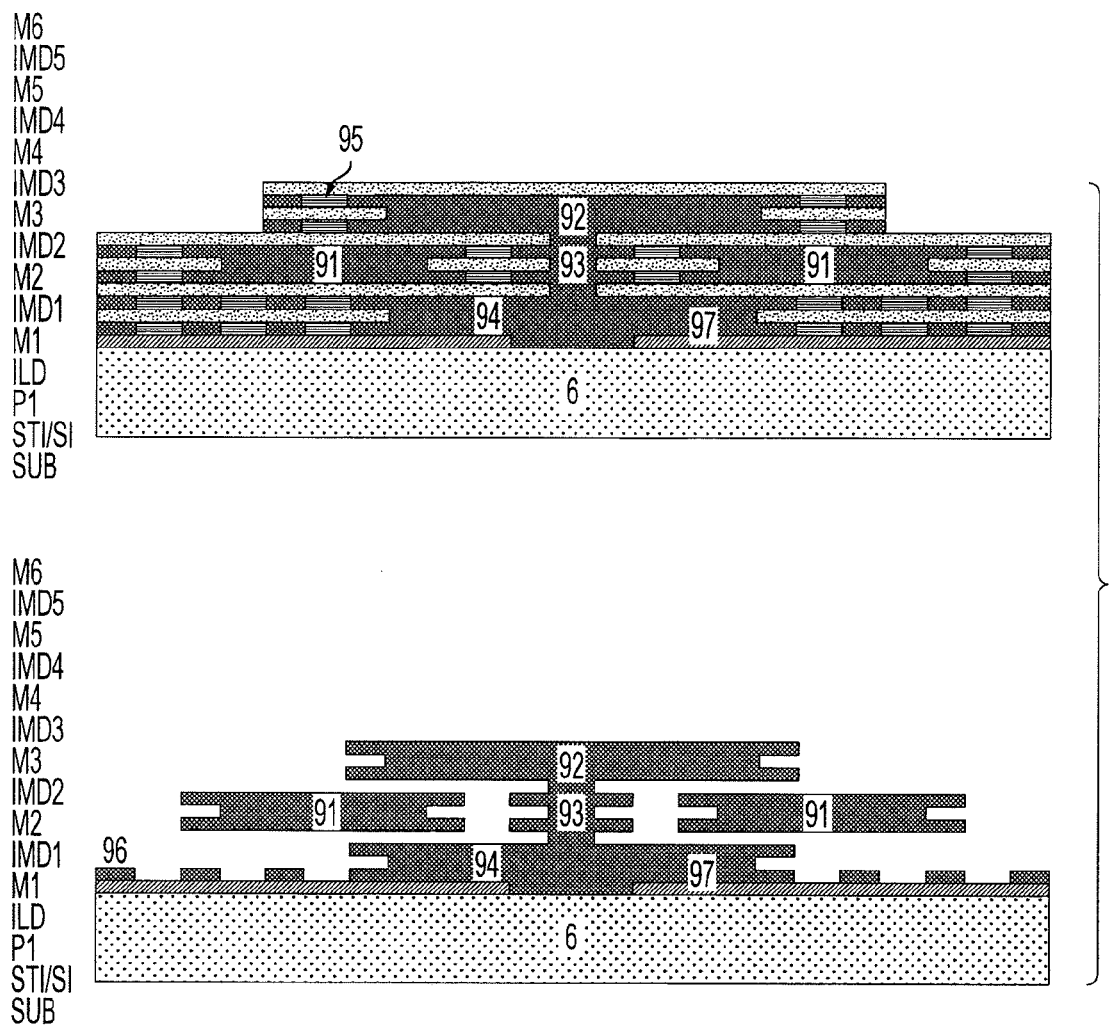
FIG. 15 Oxide structures with oxide flange-pin-flange constraints on a polysilicon layer. Top: After oxide RIE and before metal removal, Bottom: After metal removal.
Figure 16:
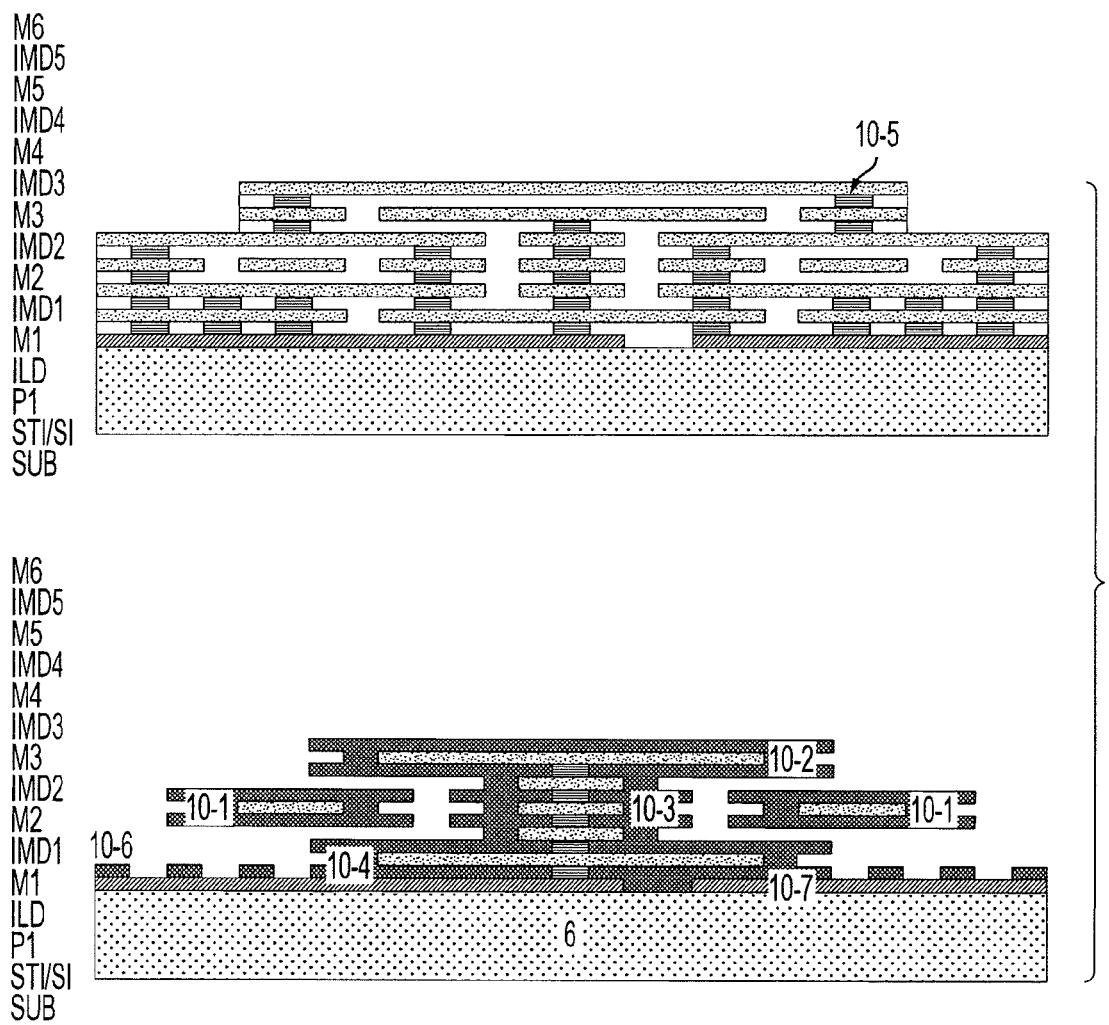
FIG. 16 OSMC structures with OSMC flange-pin-flange constraints on a polysilicon layer. Top: After oxide RIE and before metal removal, Bottom: After removal of exposed metal material.
Figure 17A:
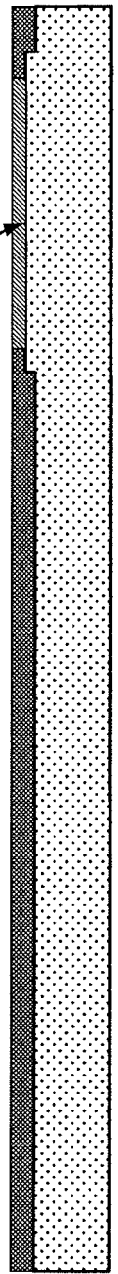
FIG. 17 Process sequences of multiple links and joints using oxide as sacrificial material.
Figure 17B:
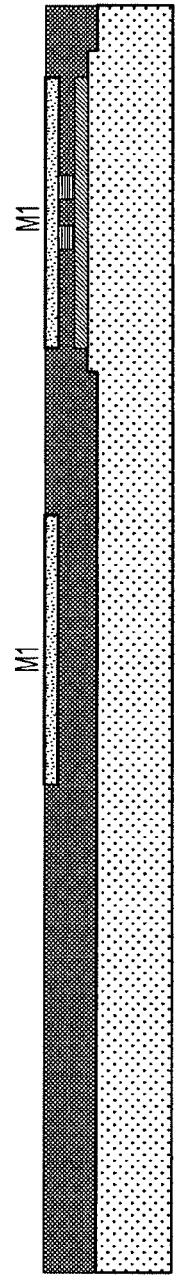
Figure 17C:
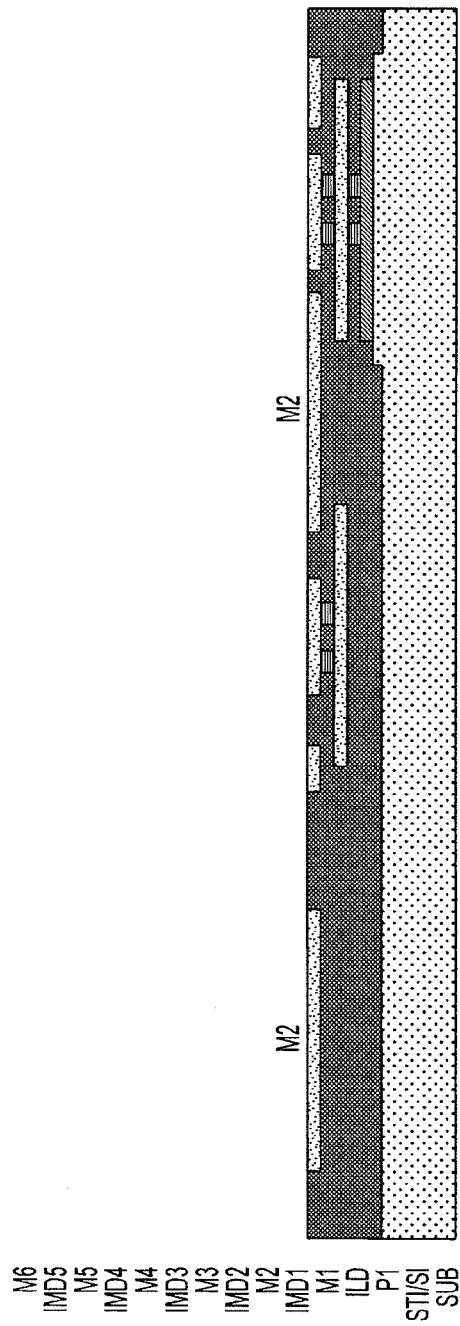
Figure 17D:
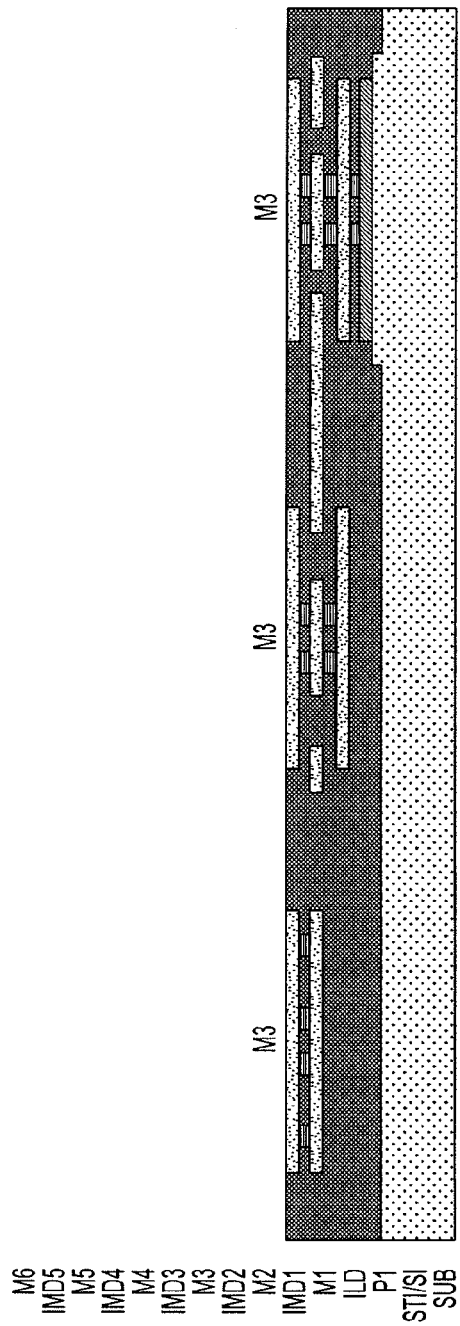
Figure 17E:
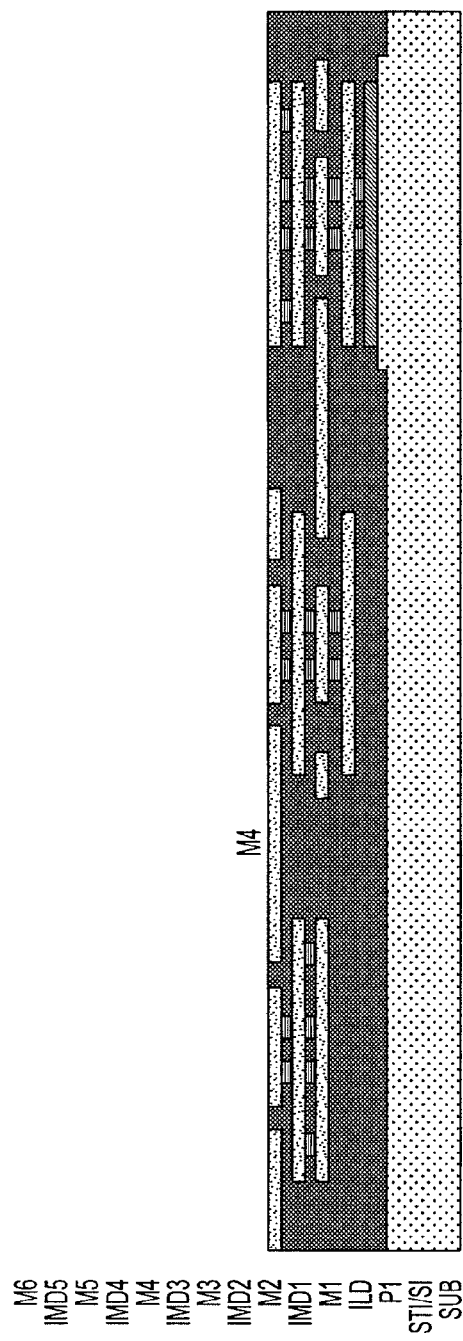
Figure 17F:
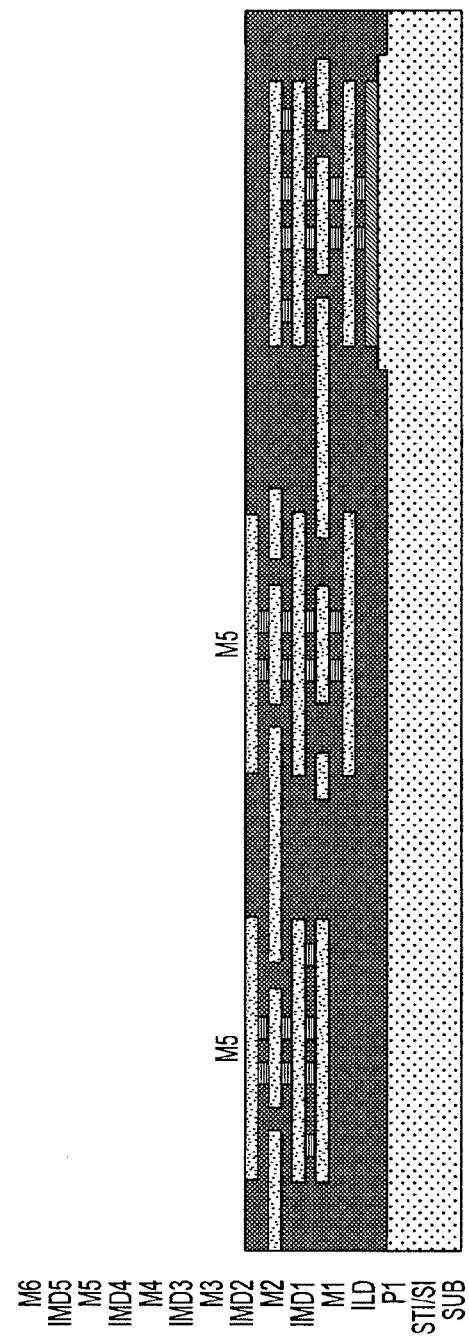
Figure 17G:
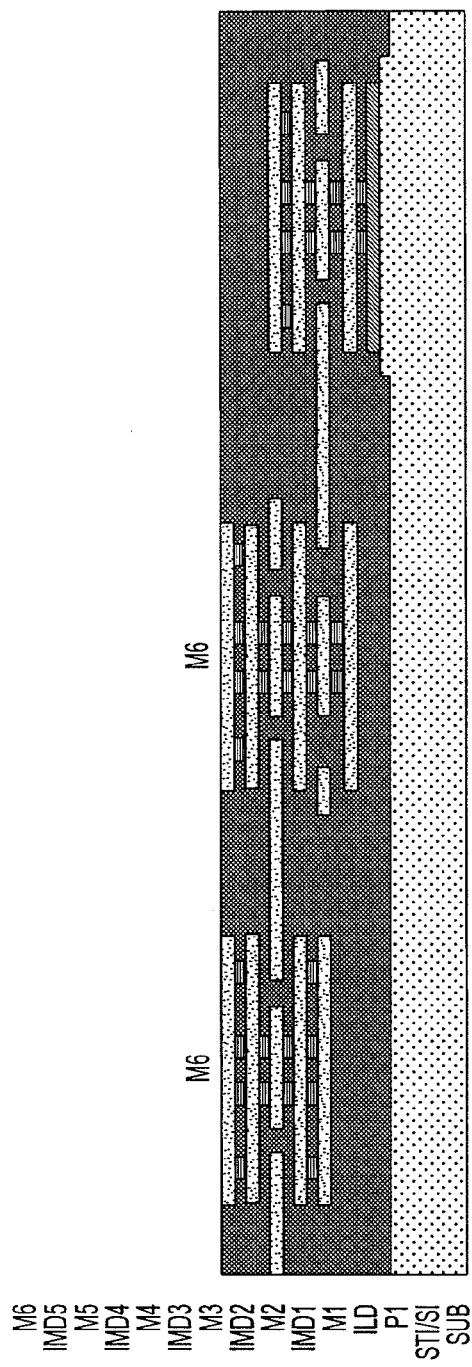
Figure 17H:
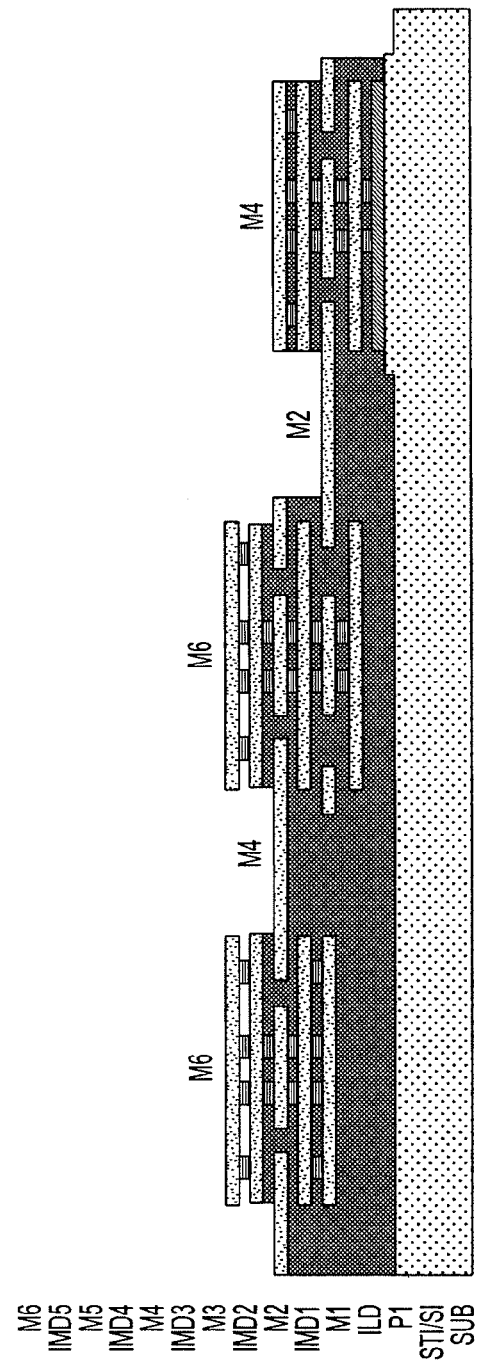

In the structures shown in FIGS. 9, 10, 11, 12, an underneath flanges maybe formed to reduce the contact area and stiction of structures as shown in FIGS. 13, 14, 15, 16 correspondently. FIG. 13 shows the oxide structures 91 with oxide flange-pin-flange constraints 92, 93, 94 on substrate 6. Top: After oxide RIE and before metal removal, Bottom: After metal removal. FIG. 14 shows the OSMC structures 10-1 with OSMC flange-pin-flange constraints 10-2, 10-3, 10-4. Top: After oxide RIE and before metal removal, Bottom: After removal of exposed metal material. FIG. 15 shows the oxide structures 91 with oxide flange-pin-flange constraints 92, 93, 94 on a polysilicon layer 97. Top: After oxide RIE and before metal removal, Bottom: After metal removal. FIG. 16 shows the OSMC structures 10-1 with OSMC flange-pin-flange constraints 10-2, 10-3, 10-4 on a polysilicon layer 10-7. Top: After oxide RIE and before metal removal, Bottom: After removal of exposed metal material.

We have described the details for the implementation of various CMOS-compatible composite structures & constraining structures and the methods of fabrication of these structures. The above methods can be used in many other processes to form constraining structures for transductions and/or motions with integrated electronics and they are not restricted to CMOS process only. Obvious extensions include but not limited to BiCMOS, BCD process, NMOS, PMOS, Bipolar etc.

What is claimed are:

1. A device patterned out of a multi-layer interconnect stack atop an Integrated Circuit (IC)-substrate, the multi-layer interconnect stack having:
   a plurality of microstructures, each microstructure comprising one or more layers of conductive material and insulating material, the microstructures including a microstructure having an upper flange structure, a lower flange structure and a pin structure between the upper and lower flange structures, the upper and lower flange structures forming a gap around the pin structure, wherein the microstructure includes a patterned conductive via material through each insulating material layer for bridging consecutive conductive material layers at selected locations; and
   an optional bottom anchor layer for anchoring at least one of the microstructures to the IC-substrate,
   wherein at least a particular one of the microstructures includes a shell portion fully enclosing the particular one microstructure,
   wherein the shell portion comprises the conductive material plus the conductive via material,
   wherein the particular one microstructure includes a core portion within the shell portion, the core portion comprising insulating layer material,
   wherein the layers of conductive material and insulating material comprise CMOS complementary-symmetry metal oxide semiconductor) compatible material, and
   wherein the microstructure is usable as part of a sensing or actuation device via movement constrained by the gap.

2. A device patterned out of a multi-layer interconnect stack atop an Integrated Circuit (IC)-substrate, the multi-layer interconnect stack having:
   a plurality of microstructures, each microstructure comprising one or more layers of conductive material and insulating material, the microstructures including a least a constraining microstructure and a constrained microstructure movable relative to the constraining microstructure, the constrained microstructure having a plate structure with a hole, the constraining microstructure having an upper flange structure, a lower flange structure and a pin structure between the upper and lower flange structure through the hole, the upper and lower flange structures forming a gap around the pin structure, the plate structure interleaved with the upper and lower flange structures within the gap, wherein movement of the constrained microstructure is constrained by the constraining microstructure within the gap between the upper and lower flange structures, wherein at least one of the constraining and constrained microstructures includes a patterned conductive via material through each insulating material layer for bridging consecutive conductive material layers at selected locations; and
   an optional bottom anchor layer for anchoring at least one of the microstructures to the IC-substrate;
   wherein at least a particular one of the microstructures includes a shell portion fully enclosing the particular one microstructure,
   wherein the shell portion comprises the insulating layer material,
   wherein the particular one microstructure includes a core portion within the shell portion, the core portion comprising the conductive layer material plus conductive via material,
   wherein the layers of conductive material and insulating material comprise CMOS (complementary-symmetry metal oxide semiconductor) compatible material, and
   wherein the device is usable as part of a sensing or actuation device via the movement.

3. A multi-part constraining microstructure (MCMS) device patterned out of a multi-layer interconnect stack atop an Integrated Circuit (IC)-substrate, the multi-layer interconnect stack having:
   a plurality of microstructural parts, each part comprising one or more layers of conductive material and insulating material, the microstructural parts including a least a pair of constraining part and a constrained part movable relative to the constraining part, the constrained part having a plate structure with a hole, the constraining part having an upper flange structure, a lower flange structure and a pin structure between the upper and lower flange structures through the hole, the upper and lower flange structures forming a gap around the pin structure, the plate structure interleaved with the upper and lower flange structures within the gap, wherein movement of the constrained part is constrained by the constraining part within range inside the gap between the upper and lower flange structures, wherein at least one of the constraining and constrained parts includes a patterned conductive via material through each insulating material layer for bridging consecutive conductive material layers at selected locations; and
   an optional bottom anchor layer for anchoring at least one of the microstructural parts to the IC-substrate, wherein the layers of conductive material and insulating material comprise CMOS (complementary-symmetry metal oxide semiconductor) compatible material, and wherein the movement of the constrained part enables sensing or actuation capabilities for the MCMS device.

4. The MCMS device of claim 3 wherein said MCMS device further comprise multiple pairs of mutually constraining parts so as to generate a multi-layered network of correspondingly constraining microstructural parts.

5. The MCMS device of claim 4 wherein at least one of the pair of mutually constraining parts is stationary anchored to the IC-substrate.

6. The MCMS device of claim 3 wherein said movement is mechanically constrained within the range to be linear, rotational or following a pre-determined geometric path.

7. The MCMS device of claim 3 wherein the one of the pair of parts is patterned to include a flange-pin geometry.

8. The MCMS device of claim 3, wherein at least one of the pair of parts comprise of conductive layer material plus conductive via material.

9. The MCMS device of claim 3, wherein at least one of the pair of parts comprise of a shell portion and a core portion of separate layer material, wherein the range for the movement is based on a topological hole between the pair of parts an wherein the core portion is fully enclosed by the shell portion face to allow the topological hole for the MCMS device patterned out of a multi-layer interconnect stack.

10. The MCMS device of claim 9, wherein the shell portion comprises insulating layer material and wherein the core portion comprises conductive layer material plus conductive via material.

11. The MCMS device of claim 5 wherein said optional bottom anchor layer is absent making the stationary microstructural part electrically connected to the IC-substrate and mechanically anchored thereto.

12. The MCMS device of claim 5 wherein said optional bottom anchor layer is present making the stationary microstructural part electrically isolated from the IC-substrate while mechanically anchored thereto.

13. The MCMS device of claim 3 wherein the IC-substrate is made of silicon, the conductive layer material is a aluminum alloy, the insulating layer material is silicon oxide, the conductive via material is tungsten and the bottom anchor layer is a bi-layer with polysilicon atop gate oxide whereby making the MCMS fabrication compatible with a complimentary metal-oxide-semiconductor (CMOS) process and also allowing the fabrication, on the same IC-substrate, of an interconnected system of the MCMS and a CMOS circuit.

* * * * *